United States Patent
Fukui

(10) Patent No.: US 6,307,407 B1
(45) Date of Patent: Oct. 23, 2001

(54) DRIVING CIRCUIT AND CHARGING PUMP BOOSTER CIRCUIT UTILIZING SAID DRIVING CIRCUIT

(75) Inventor: Eizo Fukui, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/516,545

(22) Filed: Mar. 1, 2000

(30) Foreign Application Priority Data

Mar. 8, 1999 (JP) .................................................. 11-060696

(51) Int. Cl.[7] ...................................................... H03K 3/00
(52) U.S. Cl. ............................................. 327/112; 327/478
(58) Field of Search .................................. 327/108, 109, 327/110, 111, 112, 392, 403, 405, 478, 482, 484, 489, 490, 538, 543

(56) References Cited

U.S. PATENT DOCUMENTS 5,541,541 * 7/1996 Salamina et al. ..................... 327/108
5,670,905 * 9/1997 Keeth et al. .......................... 327/333
5,825,215 * 10/1998 Sugio et al. .......................... 327/108

* cited by examiner

Primary Examiner—Jeffrey Zweizig
(74) Attorney, Agent, or Firm—Bret J. Petersen; Frederick J. Telecky, Jr.

(57) ABSTRACT

A driving circuit and a charging pump booster circuit capable of reducing the power consumption and the noise generated during switching. Transistors Q1 and Q2 are controlled based on a control signal input into an input terminal $T_{in}$, and a charge/discharge current is output to an output terminal $T_{out}$. The base of a transistor Q5, having almost the same characteristics as those of the transistor Q1, is connected to the base of the transistor Q1 in order to have the transistor Q5 generate a current corresponding to the turning on/off of the transistor Q1, and the current from said transistor Q5 is reflected toward a resistance element R1 by means of a current mirror circuit comprising transistors Q6 and Q7, so that base voltage of the transistor Q2 can be set lower while the transistor Q1 is on in order to hold the transistor Q2 to the OFF status. As a result, leak-through current in the transistors Q1 and Q2 can be reduced and switching noises created by said leak-through current can be reduced.

10 Claims, 1 Drawing Sheet

DRIVING CIRCUIT AND CHARGING PUMP BOOSTER CIRCUIT UTILIZING SAID DRIVING CIRCUIT

FIELD OF THE INVENTION

The present invention pertains to a charging pump booster circuit for supplying a voltage different from the source voltage and a driving circuit used for said booster circuit.

BACKGROUND OF THE INVENTION

A booster circuit is widely utilized for a circuit that requires a voltage level different from the source voltage, for example, a voltage higher than the source voltage or a negative voltage. An ordinary charging pump-type booster circuit has several boosting stages configured with rectifier elements, such as diodes and capacitors, depending on the required boosted voltage.

FIG. 2 is a circuit diagram showing an example of the configuration of a popular booster circuit. As shown in the figure, said booster circuit is configured with a booster control circuit 10 comprising driving circuits CH1 and CH2, several diodes D1, D2, ..., D7, and capacitors C1, C2, ..., C7.

A switching signal SW, as a clock signal having a fixed frequency, is input into the input terminal of the booster control circuit 10. In the booster control circuit 10, the driving circuits CH1 and CH2 hold their respective output terminals T1 and T2 alternately to a high or a low level based on the switching signals SW input.

The diodes D1, D2, ..., D7 are connected in series between the feed line of a source voltage $V_{cc}$ and the output terminal $T_B$ of the booster circuit. Terminals of the capacitors C1, C2, ..., C6 are connected on one end to the midpoints ND1, ND2, ..., ND6 between the diodes D1, D2, ..., D7, and the other ends are connected alternately to the output terminals T1 and T2 of the booster circuit 10. The capacitor C7 is connected between the output terminal $T_B$ of the booster circuit and the ground potential GND. Also, m quantity of Zener diodes ZD1, ..., ZDm are series-connected in parallel with the capacitor C7. Furthermore, the number m of the quantity of Zener diodes is set based on the value of the desired boosted voltage $V_B$.

When the booster circuit shown in FIG. 2 is at work, the booster circuit 10 outputs the control signal from the output terminals T1 and T2 to be held at the high level and the low level alternately by the driving circuits CH1 and CH2 based on the switching signals SW input. For example, when the output terminal T1 is at the high level and the output terminal T2 is at the low level, potentials at the nodes ND1, ND3, and ND5 are raised due to the capacitive coupling of the capacitors C1, C3, and C5, and as a result, the capacitors C2, C4, and C6 get charged. On the other hand, when the output terminal T1 is at the low level and the output terminal T2 is at the high level, potentials at the nodes ND2, ND4, and ND6 are raised due to the capacitive coupling of the capacitors C2, C4, and C6, and as a result, the capacitors C3, C5, and C7 get charged. Furthermore, at this time, the capacitor C1 connected to the anode side of the diode D1 gets charged by the source voltage $V_{cc}$ to a voltage lower than the source voltage $V_{cc}$ by the amount equivalent to the voltage drop in the forward direction of the diode D1.

As described above, the capacitors at the respective boosting stages charge/discharge in turn based on the control signal from the booster circuit 10, whereby the source voltage $V_{cc}$ and the boosted voltage $V_B$ corresponding to the number of the boosting stages are output from the output terminal of the booster circuit 10. In the case of the booster circuit shown in FIG. 2, while a boosted voltage $V_B$ higher than the source voltage $V_{cc}$ can be output, a negatively boosted voltage can also be generated by changing the direction of the diodes D1, D2, ..., D7.

FIG. 3 is a circuit diagram showing an example of the configuration of the driving circuits CH1 and CH2 constituting the booster control circuit 10. As shown in the figure, driving circuits CHi (i=1, 2) are configured with resistance elements R1 and R2, a pnp transistor Q1, and npn transistors Q2, Q3, and Q4. Bases of the transistors Q3 and Q4 are both connected to an input terminal $T_{in}$, the collector of the transistor Q3 is connected to the feed line of the source voltage $V_{cc}$ via the resistance element R1, and its emitter is grounded. Similarly, the collector of the transistor Q4 is connected to the feed line of the source voltage $V_{cc}$ via the resistance element R2, and its emitter is grounded.

Base of the transistor Q1 is connected to the collector of the transistor Q4, and its emitter is connected to the feed line of the source voltage $V_{cc}$. Base of the transistor Q2 is connected to the collector of the transistor Q3, and its emitter is grounded. Furthermore, collectors of the transistors Q1 and Q2 are connected to each other, and the junction point is connected to an output terminal $T_{out}$.

Moreover, when the driving circuits CH1 and CH2, shown in FIG. 3, are used to configure the booster circuit 10 shown in FIG. 2, the 2 driving circuits CH1 and CH2 are connected in series, input terminal $T_{in}$ of the driving circuit CH1 of the former stage is connected to the input terminal for the switching signal SW, and input terminal $T_{in}$ of the driving circuit CH2 of the latter stage is connected to the output terminal $T_{out}$ of the driving circuit of the former stage. Furthermore, output terminal of the driving circuit CH1 of the former stage constitutes the output terminal T1 shown in FIG. 2, and output terminal of the driving circuit CH2 of the latter stage constitutes the output terminal T2 shown in FIG. 2.

In the driving circuits CH1 and CH2 shown in FIG. 3, level of the signal from the output terminal $T_{out}$ is controlled based on the signal input into input terminal $T_{in}$. For example, when a high-level signal is input into the input terminal $T_{in}$, the transistors Q3 and Q4 are turned on, and the collectors of these transistors are held to the low level. Accordingly, the transistor Q1 is turned on, the transistor Q2 is turned off, and the output terminal $T_{out}$ is held to the high level. Also, a charge current $I_{out}$ is output from said output terminal $T_{out}$. To the contrary, when the input terminal $T_{in}$ is held to the low level, the transistors Q3 and Q4 are turned off, and the collectors of these transistors are both held to the high level. Accordingly, the transistor Q1 is turned off, and the transistor Q2 is turned on, so that the output terminal $T_{out}$ is held to the low level, and a drop current, that is, a discharge current which flows from the output terminal $T_{out}$ into the ground side via the transistor Q2 is also supplied.

In the booster control circuit configured with the 2-stage driving circuits CH1 and CH2 connected in series in said manner, the output terminals T1 and T2 are held to the high level and the low level alternately based on the switching signals SW input, and the capacitors C1 through C6 of the respective boosting stages shown in FIG. 2 accordingly get charged and discharged repeatedly. As a result, the boosted voltage $V_B$ higher than the source voltage $V_{cc}$ is output.

Incidentally, in the case of said conventional booster circuit, when an analog integrated circuit having so-called planer structure, in which circuit elements are formed on a plane of a semiconductor substrate, is used, the circuit element, in particular the transistors, may be difficult to form and still attain desired characteristics. For example, when the pnp transistor Q1 shown in FIG. 3 is formed by means of a lateral structure, a parasitic capacitance is added between the base and the substrate due to the nature of said configuration. As a result, because the frequency ($f_T$ transition frequency) at which the current amplification rate β of the transistors becomes 1 decreases, that is, high-frequency characteristics of the transistor deteriorate, when the switching operation is carried out to turn on/off the transistors Q3 and Q4 repeatedly based on the switching signals SW, on/off timing of the transistor Q1 gets delayed, so that the transistors Q1 and Q2 may get turned on at the same time. In such a case, a leak-through current, a cause of an increase in power consumption, flows between the feed line of the source voltage ($V_{cc}$) and the ground potential. Furthermore, a large current flows within the circuit due to the occurrence of the leak-through current during the switching operation causing a problem with louder switching noises.

The present invention was made in light of such a problem, and its purpose is to present driving circuits capable of reducing the power consumption and the noise generated during the switching operation as well as a charging pump booster circuit utilizing said [driving circuits].

SUMMARY OF THE INVENTION

In order to achieve said objective, the driving circuits of the present invention are provided with a first first-level conductive-type transistor electrically [sic] connected between the feed terminal and the output terminal of a first source voltage, a second second-level conductive-type transistor connected between the feed terminal and the output terminal of a second source voltage, a first control circuit which makes either said first or second transistor conductive in response to an input signal and makes the other transistor nonconductive, and a second control circuit which sustains the nonconductive status of said second transistor until said first transistor transitions from conductive status to nonconductive status.

In addition, the charging pump booster circuit of the present invention contains several rectifier elements connected in series between the voltage input terminal and the voltage output terminal, several capacitors connected respectively between the midpoints on the connections between the several rectifier elements at the odd-numbered positions and the first control terminal, several capacitors connected respectively between the midpoints on the connections between the several rectifier elements at the even-numbered positions and the second control terminal, and a first and a second driving circuits connected in series along with a booster control circuit for supplying first and second control signals of different phases from the output terminals of said first and second driving circuits respectively to said first and second control terminals; wherein, said first and second driving circuits have a first first-level conductive-type transistor connected between the feed terminal of a first source voltage and the output terminal, a second second-level conductive-type transistor connected between the feed terminal of a second source voltage and said output terminal, a first control circuit which makes either said first or the second transistor conductive and makes the other transistor nonconductive in response to an input signal, and a second control circuit which sustains nonconductive status of said second transistor until said first transistor transitions from conductive status to nonconductive status.

Ideally, in the present invention, said second control circuit includes a third first-level conductive-type transistor connected to the feed terminal of said first source voltage and a current mirror connected between said third transistor and the feed terminal of said second source voltage, wherein the control terminal of said first transistor is connected to the control terminal of said third transistor, and the control terminal of said second transistor is connected to said current mirror.

REFERENCE NUMERALS AND SYMBOLS AS SHOWN IN THE DRAWINGS

10 . . . booster control circuit; CH1, CH2, CHa1, CHa2 . . . driving circuit; Q1, Q5 . . . pnp transistor; Q2, Q3, Q4, Q6, Q7 . . . npn transistor; R1, R2, R3, R4 . . . resistance element; $V_{cc}$ . . . source voltage; and GND . . . ground potential.

DESCRIPTION OF EMBODIMENTS

Figure 1:
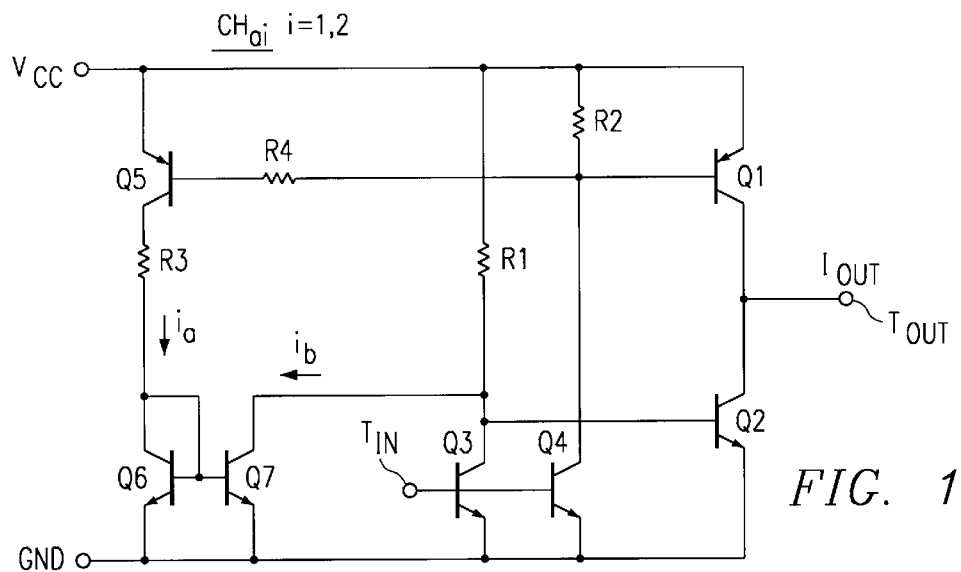
FIG. 1 is a circuit diagram showing an embodiment of the driving circuits pertaining to the present invention.

FIG. 1 is a circuit diagram showing an embodiment of the driving circuits pertaining to the present invention.

As shown in the figure, the driving circuits CHai (i=1, 2) of the present embodiment are configured with resistance elements R1, R2, R3, and R4, and pnp transistors Q1 and Q5, npn transistors Q2, Q3, Q4, Q6, and Q7.

Bases of the transistors Q3 and Q4 are both connected to terminal $T_{in}$, the collector of the transistor Q3 is connected to the feed line of a source voltage $V_{cc}$ via the resistance element R1, and its emitter is grounded. Similarly, the collector of the transistor Q4 is connected to the feed line of the source voltage $V_{cc}$ via the resistance element R2, and its emitter is grounded.

Base of the transistor Q1 is connected to the collector of the transistor Q4, and its emitter is connected to the feed line of the source voltage $V_{cc}$. Base of the transistor Q2 is connected to the collector of the transistor Q3, and its emitter is grounded. Furthermore, the collectors of the transistors Q1 and Q2 are connected to each other, and their junction point is connected to an output terminal $T_{out}$.

Base of the transistor Q5 is connected to the base of the transistor Q1 via the resistance element R4, and its emitter is connected to the feed line of the source voltage $V_{cc}$. Bases of the transistors Q6 and Q7 are connected to each other, and their junction point is connected to the collector of the transistor Q6. Furthermore, said junction point is connected to the collector of the transistor Q5 via the resistance element R3. Emitters of the transistors Q6 and Q7 are grounded, and the collectors of the transistor Q7 is connected to the collector of the transistor Q3 in the same manner as that for the base of the transistor Q2.

In said driving circuits, the transistors Q6 and Q7 constitute the current mirror. That is, the current $i_b$ flowing into the collector of the transistor Q7 is set based on the current $i_a$ flowing into the resistance element R3.

Operation of the driving circuits of the present embodiment will be explained below in reference to FIG. 1. Signal levels at the output terminal $T_{out}$ of the driving circuits CHa1 and CHa2 are controlled based on the levels of the signals input respectively into their input terminals $T_{in}$, and a charge/discharge current is output into said output terminals $T_{out}$. For example, when the input signal is at the high level, the transistors Q3 and Q4 are turned on and the collectors of these transistors are both held to the low level. Accordingly, the transistor Q1 is turned on and the transistor Q2 is turned off, thus the output terminal $T_{out}$ is held to the high level. Also, a charge current $I_{out}$ is output from said output terminal $T_{out}$.

To the contrary, when the input terminal $T_{in}$ is held to the low level, the transistors Q3 and Q4 are turned off and the collectors of these transistors are both held to the high level. Accordingly, the transistor Q1 is turned off and the transistor Q2 is turned on, so that the output terminal $T_{out}$ is held to the low level, and a drop current, that is, a discharge current which flows from the output terminal $T_{out}$ into the ground side via the transistor Q2 is also supplied.

In the present embodiment, the transistors Q5, Q6, and Q7 are used to prevent a leak-through current from flowing into the transistors Q1 and Q2 during the switching operation. Said [prevention] will be further explained in detail below. In response to the fall of the signal input into the input terminal $T_{in}$, the transistors Q3 and Q4 switch from the ON status to the OFF status. Normally, the transistor Q1 switches from the ON status to the OFF status, and the transistor Q2 switches from the OFF status to the ON status along with said switching of the transistors Q3 and Q4. However, the pnp transistor Q1, having a lateral structure, has poor frequency characteristics, so that said switching gets delayed from the switching of the status of the transistor Q4. Thus, if no measures are taken, after the transistor Q2 has already switched to the ON status, the transistor Q1 is still in the ON status. In other words, a condition under which the transistors Q1 and Q2 are turned on at the same time while they are being switched occurs, and a leak-through current gets generated.

In the case of the driving circuit of the present embodiment, a current mirror circuit configured with a transistor Q5 and the transistors Q6 and Q7 is used to configure a switching control circuit to prevent a leak-through current from being generated. As shown in FIG. 1, because the base of the transistor Q5 is connected to the base of the transistor Q1 via the resistance element R4, base voltages of the transistors Q5 and Q4 are held to almost the same level. Thus, if the transistors Q5 and Q1 are formed in such a way that their characteristics match, when the transistor Q1 is on, the transistor Q5 is also on. Current $i_a$ of the collector of the transistor Q5 is input into a current mirror circuit comprising the transistors Q6 and Q7, and a current $i_b$, corresponding to the current $i_a$, flows into the transistor Q7.

As the input signal changes to the low level, and the transistor Q3 gets turned off, the current $i_b$ flows into the resistance element R1, and a voltage drop $i_b$ R1 occurs in the resistance element R1. Accordingly, the base voltage of the transistor Q2 becomes $V_{cc}$-$i_b$ R1. Then, the base voltage $V_{cc}$-$i_b$ R1 of the transistor Q2 can be made lower than the base-emitter voltage $V_{BE2}$ by setting the resistance value of the resistance element R1 appropriately. As a result, the transistor Q2 is held in the OFF status while the current $i_b$ flows in the resistance element R1.

As the transistor Q1 switches from the ON status to the OFF status, the transistor Q5 also changes to the OFF status. As the current $i_a$ drops, the current $i_b$ also drops, and the base voltage of the transistor Q2 rises. When the base-emitter voltage $V_{BE2}$ of the transistor Q2 is reached, the transistor Q2 turns on.

In other words, in the case of the booster circuit of the present embodiment, the transistors Q1 and Q2 are turned on/off based on the control signal input from the input terminal $T_{in}$ in order to output the charge/discharge current into the output terminal $T_{out}$. The base of the transistor Q5, having almost the same characteristics as those of the transistor Q1, is connected to the base of the transistor Q1 in order to have the transistor Q5 generate a current corresponding to the turning on/off of the transistor Q1. The current of said transistor Q5 is reflected toward the resistance element R1 using the current mirror circuit comprising of transistors Q6 and Q7 to set the base voltage of the transistor Q2 lower while the transistor Q1 is on in order to hold the transistor Q2 to the OFF status, so that the transistors Q1 and Q2 can be prevented from turning on at the same time. Thus, the leak-through current flowing into the transistors Q1 and Q2 can be reduced, and the switching noises created by said leak-through current can be restrained.

Figure 2:
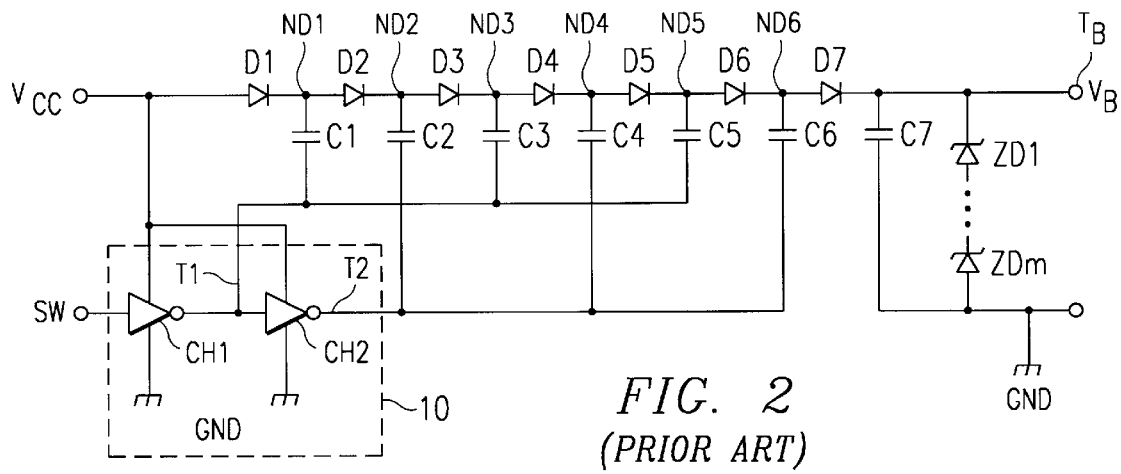
FIG. 2 is a circuit diagram showing the configuration of the booster circuit containing the driving circuits.
Figure 3:
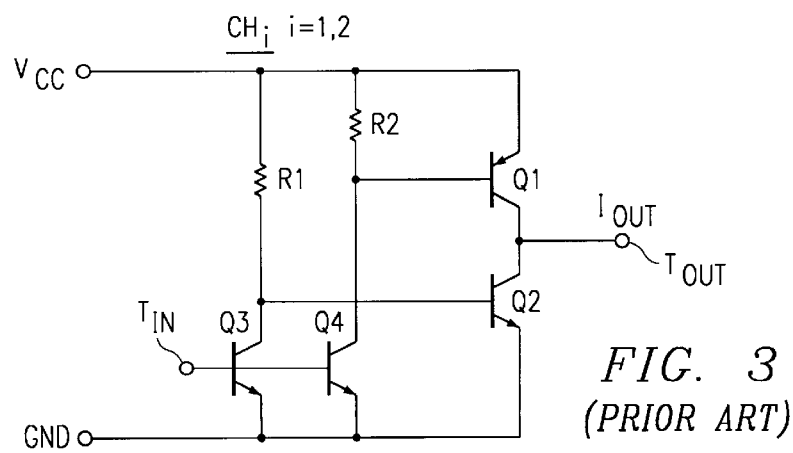
FIG. 3 is a circuit diagram showing an example of the conventional driving circuit.

In the present invention, the booster control circuit 10 shown in FIG. 2 is configured with said driving circuits CHa1 and CHa2. However, in such a case, a switching signal SW, which alternates the high level and the low level, for example, a clock signal having a prescribed frequency, is input into the input terminal of the driving circuit CHa1. On the other hand, a signal having reverse logic to that of the switching signal SW is input into the input terminal $T_{in}$ of the driving circuit CHa2. In such a case in FIG. 2, the output terminal of the driving circuit CHa1 may be connected to the input terminal of the driving circuit CHa2 via an inverter. The output terminal $T_{out}$ of the driving circuit CHa1 is connected to the capacitors C1, C3, and C5 shown in FIG. 2, for example; and the output terminal $T_{out}$ of the driving circuit CHa2 is connected to the capacitors C2, C4, and C6 shown in FIG. 2. In the case of a booster circuit having this kind of configuration, because the capacitors C1 through C6 get charged/discharged in turn based on the switching signal SW, a boosted voltage $V_B$ higher than the source voltage can be obtained from the output terminals of the driving circuits.

In the booster circuit configured using the driving circuits CHa1 and CHa2 described above, because the power consumption by the entire booster circuit can be reduced by reducing the leak-through current of the respective driving circuits CHa1 and CHa2 and the switching noise created by the leak-through current can be reduced, an integrated circuit, in which a booster circuit and an analog integrated circuit coexist, can be configured and applied to IC's used for many purposes.

As it has been described above, the driving circuits and the booster circuit utilizing them have an advantage that leak-through current created by the switching operation can be reduced using a simple circuit configuration, so that the power consumption can be reduced, switching noise created by the leak-through current can be restrained, and a multi-purpose integrated circuit mixed with an analog circuit can be configured.

What is claimed is:

1. A driving circuit comprising:
   a first drive transistor having a control terminal and connected between an output terminal and a first source voltage,
   a second drive transistor having a control terminal and connected between the output terminal and a second source voltage,
   a first control circuit which makes either the first drive transistor or the second drive transistor conductive in response to an input signal and makes the other transistor nonconductive, a second control circuit which sustains the nonconductive status of the second drive transistor until the first drive transistor transitions from conductive status to nonconductive status, and wherein the second control circuit includes a third transistor connected to the first source voltage, and a current mirror connected between the third transistor and the second source voltage, and the control terminal of the first drive transistor is connected to the control terminal of the third transistor, and the control terminal of the second drive transistor is connected to the current mirror.

2. The driving circuit of claim 1, in which the first control circuit includes a first resistance element and a fourth transistor connected between the first source voltage and the second source voltage as well as a second resistance element and a fifth transistor connected between the first source voltage and the second source voltage, wherein the control terminal of the first drive transistor is connected to the junction of the second resistance element and the fifth transistor, and the control terminal of the second drive transistor is connected to the junction of the first resistance element and the fourth transistor.

3. The driving circuit of claim 1, in which the current mirror includes a sixth transistor connected between the third transistor and the second source voltage and a seventh transistor connected between the control terminal of the second drive transistor and the second source voltage, wherein the control terminal of the seventh transistor is connected to the control terminal of the sixth transistor as well as to the third transistor.

4. The driving circuit of claim 2, in which the current mirror includes a sixth transistor connected between the third transistor and the second source voltage and a seventh transistor connected between the control terminal of the second drive transistor and the second source voltage, wherein the control terminal of the seventh transistor is connected to the control terminal of the sixth transistor as well as to the third transistor.

5. A driving circuit comprising:
a first PNP drive transistor having a base and connected between an output terminal and a first source voltage,
a second NPN drive transistor having a base and connected between the output terminal and a second source voltage,
a first control circuit which makes either the first drive transistor or the second drive transistor conductive in response to an input signal and makes the other transistor nonconductive,
a second control circuit which sustains the nonconductive status of the second drive transistor until the first drive transistor transitions from conductive status nonconductive status, and
wherein the second control circuit includes a third transistor having a control terminal and connected to the first source voltage, and a current mirror connected between the third transistor and the second source voltage, and the base of the first drive transistor is connected to the control terminal of the third transistor, and the base of the second drive transistor is connected to the current mirror.

6. The driving circuit of claim 5, in which the first control circuit includes a first resistance element and a fourth transistor connected between the first source voltage and the second source voltage as well as a second resistance element and a fifth transistor connected between the first source voltage and the second source voltage, wherein the control terminal of the first drive transistor is connected to the junction of the second resistance element and the fifth transistor, and the control terminal of the second drive transistor is connected to the junction of the first resistance element and the fourth transistor.

7. The driving circuit of claim 5, in which the current mirror includes a sixth transistor connected between the third transistor and the second source voltage and a seventh transistor connected between the control terminal of the second drive transistor and the second source voltage, wherein the control terminal of the seventh transistor is connected to the control terminal of the sixth transistor as well as to the third transistor.

8. The driving circuit of claim 6, in which the current mirror includes a sixth transistor connected between the third transistor and the second source voltage and a seventh transistor connected between the control terminal of the second drive transistor and the second source voltage, wherein the control terminal of the seventh transistor is connected to the control terminal of the sixth transistor as well as to the third transistor.

9. A charging pump booster circuit comprising;
a plurality of rectifier elements connected in series between a voltage input terminal and a voltage output terminal,
a plurality of capacitors connected between the several rectifier elements at the odd-numbered positions and the first control terminal,
a plurality of capacitors connected respectively between several rectifier elements at the even-numbered positions and the second control terminal, and
a booster control circuit containing a first driving circuit for supplying a first control signal into the first control terminal and a second control circuit for supplying a second control signal having a logic reverse to that of the first control signal into the second control terminal,
wherein the first and second driving circuits comprise:
a first drive transistor having a control terminal and connected between an output terminal and a first source voltage,
a second drive transistor having a control terminal and connected between the output terminal and a second source voltage,
a first control circuit which makes either the first drive transistor or the second drive transistor conductive in response to an input signal and makes the other transistor nonconductive,
a second control circuit which sustains the nonconductive status of the second drive transistor until the first drive transistor transitions from conductive status to nonconductive status, and
wherein the second control circuit includes a third transistor connected to the first source voltage, and a current mirror connected between the third transistor and the second source voltage, and the control terminal of the first drive transistor is connected to the control terminal of the third transistor, and the control terminal of the second drive transistor is connected to the current mirror.

10. The circuit of claim 9, in which the current mirror includes a sixth transistor connected between the third transistor and the second source voltage and a seventh transistor connected between the control terminal of the second drive transistor and the second source voltage, wherein the control terminal of the seventh transistor is connected to the control terminal of the sixth transistor as well as to the third transistor.

\* \* \* \* \*